United States Patent [19]
Kobatake

[11] Patent Number: 5,198,998
[45] Date of Patent: Mar. 30, 1993

[54] ERASABLE PROGRAMMABLE READ ONLY MEMORY

[75] Inventor: Hiroyuki Kobatake, Tokyo, Japan

[73] Assignee: NEC Corporation, Tokyo, Japan

[21] Appl. No.: 729,557

[22] Filed: Jul. 15, 1991

[30] Foreign Application Priority Data

Jul. 13, 1990 [JP] Japan .................................. 2-186042

[51] Int. Cl.$^5$ ............................................. G11C 11/34
[52] U.S. Cl. ............................... 365/185; 365/189.09; 365/189.11
[58] Field of Search ............... 365/185, 189.09, 189.01, 365/189.11

[56] References Cited

U.S. PATENT DOCUMENTS

| | | | |
|---|---|---|---|
| 4,597,062 | 6/1986 | Asano et al. | 365/185 X |
| 4,601,020 | 7/1986 | Arakawa et al. | 365/185 X |
| 4,811,292 | 3/1989 | Watanabe | 365/189.11 X |
| 4,910,710 | 3/1990 | Kobatake | 365/189.01 |
| 4,979,146 | 12/1990 | Yokoyama et al. | 365/185 |
| 5,025,417 | 6/1991 | Miyamoto et al. | 365/185 X |
| 5,075,890 | 12/1991 | Itoh et al. | 365/185 X |

Primary Examiner—Eugene R. LaRoche
Assistant Examiner—Do Hyun Yoo
Attorney, Agent, or Firm—Leydig, Voit & Mayer

[57] ABSTRACT

A read only semiconductor memory includes a memory cell matrix including a number of floating-gate type erasable programmable memory cells. A column selector being connected between a plurality of column lines of the memory cell matrix and a writing circuit and a sense amplifier. A column decoder has a plurality of outputs each being connected through a corresponding transfer gate to the column selector and also being pulled up to a high voltage. A row decoder has a plurality of outputs each being outputted through a corresponding transfer gate to a corresponding one of row lines of memory cell matrix and also being pulled up to a high voltage to the outputs of the row decoder. Each of the transfer gates is formed of an enhancement type or a substrate-$V_T$ type field effect transistor. A control circuit including a pump-up circuit receives a control signal for supplying a gate voltage signal to gates of all the field effect transistors.

8 Claims, 4 Drawing Sheets

ERASABLE PROGRAMMABLE READ ONLY MEMORY

BACKGROUND OF THE INVENTION

1. Field of the Invention

The present invention relates to a semiconductor memory, and more specifically an erasable programmable read only semiconductor memory (called "EPROM" in this specification).

2. Description of Related Art

Conventional EPROMs have been composed of a number of erasable programmable read only memory cells (for example, floating gate type MOS-FETs (metal-oxide-semiconductor field effect transistor)) arranged in the form of a matrix having a plurality of row lines and a plurality of column lines. Sources of all the memory cells are connected in common to ground. The memory cells arranged in each one row has their gates connected in common to one corresponding row line, and the memory cells arranged in each one column has their sources connected in common to one corresponding row line. Each of the row lines is pulled through an associated resistor to a voltage called Vpp, and is connected to one corresponding output of a row decoder through a transfer gate which is formed of a depletion N-channel MOS-FET. Each of the column lines is connected through a corresponding column selection transistor of a column selector to a common node which is connected to a read circuit such as a sense amplifier, and which is also connected to the voltage Vpp through a write control gate adapted to be on-off controlled by a write signal. A gate of each column selection transistor of the column selector is pulled through an associated resistor to the voltage Vpp, and is connected to one corresponding output of a column decoder through a transfer gate which is formed of a depletion N-channel MOS-FET. Gates of the depletion N-channel MOS-FETs of the row decoder and the column decoder are connected in common to receive a control signal so that the depletion N-channel MOS-FETs are selectively turned on when data is read or written.

In the above mentioned EPROM, when data is read, the voltage Vpp is brought to a voltage equal to a drain voltage Vdd, and the control signal is brought to a high level which is also equal to the drain voltage Vdd. On the other hand, the write signal is brought to a low level which is equal to a ground level (GND). In this condition, assuming that a threshold of the depletion N-channel MOS-FETs is $V_{TD}$, since the gates of the depletion N-channel MOS-FETs are applied with Vdd, a potential not greater than $(Vdd+|V_{TD}|)$ can pass through the transfer gates of the depletion N-channel MOS-FETs.

On the other hand, each of the row decoder and the column decoder outputs a high level (Vdd) from only one selected output and a low level (GND) from the other outputs, namely non-selected outputs. Therefore, the column selection transistor receiving the high level at its gate is turned on, so that one column line is selected by the turned-on column selection transistor. One memory cell is selected by the selected one column line and one row line supplied with the high level from the row decoder, so that the gate of the selected memory cell is supplied with Vdd, and the drain of the selected memory cell is applied with an operating point voltage of the sense amplifier. Here, assuming that Vdd=5 V, if a threshold $V_{TM}$ of the selected memory cell is 2 V, the selected memory cell is turned on, so that the sense amplifier outputs "0". On the other hand, if the threshold $V_{TM}$ of the selected memory cell is 6 V, the selected memory cell is turned off, so that the sense amplifier outputs "1". Thus, data stored in the selected memory cell is read through the selected one column line and the turned-on column selection transistor to the sense amplifier.

As mentioned above, all the outputs of the row decoder and the column decoder are connected to the voltage Vpp through the respective pull-up resistors. Since the pull-up resistors are set to have a high resistance (for example 1 MΩ), the non-selected outputs of the row decoder and the column decoder are maintained at a low level in the above mentioned data reading operation.

On the other hand, when data is written, the voltage Vpp is brought to a high voltage (for example, 12.5 V), and the control signal is brought to the low level (GND). Similarly to the case of the data reading, the column selector outputs the voltage Vdd from its selected output. Therefore, the depletion N-channel MOS-FET (of the transfer gate) is biased in such a manner that the drain voltage is Vpp (for example, 12.5 V), the source voltage is Vdd (for example, 5 V), and the gate is ground level. Here, since the condition for the cut-off of the depletion N-channel MOS-FET is $Vdd > |V_{TD}|$, if Vdd=5 V and $V_{TD} = -2$ V, the depletion N-channel MOS-FET is cut off. Therefore, the drain of the cut-off depletion N-channel MOS-FET is pulled up to the voltage Vpp by action of the pull-up resistor, so that the column selection transistor having the gate connected to the cut-off depletion N-channel MOS-FET is turned on. Namely, one column line is selected. On the other hand, the non-selected outputs of the column decoder are pulled up through the pull-up resistors. However, as mentioned above, since the pull-up resistors have the high resistance, the non-selected outputs of the column selector are maintained at the low level, and therefore, non-selected column selector transistors are maintained off. The row decoder similarly operates so that only one row line is selected and the other row lines are not selected.

In this condition, if the write signal is at a high level (Vpp), the gate of the selected memory cell is applied with the voltage Vpp, and the drain of the selected memory cell is applied with a voltage of $(Vpp - V_{TN})$. As a result, the threshold $V_{TM}$ of the selected memory cell is shifted from 2 V to 6 V, and therefore, "1" is written. On the other hand, if the write signal is at a low level (GND), although the gate of the selected memory cell is applied with the voltage Vpp, since the drain of the selected memory cell is not applied with a high voltage, the threshold $V_{TM}$ of the selected memory cell is maintained at 2 V. Namely, a not-written condition is maintained.

Written memory cells can be erased by irradiation of ultraviolet rays. For example, the threshold of 6 V is returned to 2 V. Thus, it is possible to read data from arbitrary selected memory cell and to write data to arbitrary selected memory cell.

As mentioned above, the conventional EPROMs have used the depletion N-channel MOS-FETs in both of the column decoder and the row decoder. Therefore, a process for forming the depletion N-channel MOS-FETs has been required. This has been disadvantageous since the number of ion implantation steps is increased and since the total process for manufacturing the EPROM becomes long.

In a writing period, if Vdd is smaller than $|V_{TD}|$, the depletion N-channel MOS-FETs of the column decoder and the row decoder are not cut off, so that the selected outputs of the row decoder and the column decoder cannot be pulled up by the associated high resistance pull-up resistors. As a result, it becomes impossible to write.

In a reading period, on the other hand, in order to read data at a high speed, it is required that an ON resistance $R_D$ of the transfer gate (the depletion N-channel MOS-FET) is small, so that the row decoder and the column decoder can be driven at a high speed. Assuming that a drain voltage, a gate voltage and a source voltage of the transfer gate (the depletion N-channel MOS-FET) are Vdd, Vdd and (Vdd$-\Delta v$), respectively, this ON resistance $R_D$ is expressed in the following equation:

$$I_D = \beta_D \{(\Delta v - V_{TD}) \cdot \Delta v - (\tfrac{1}{2})\Delta v^2\}$$
$$\approx -\beta_D \cdot V_{TD} \cdot \Delta v$$

Therefore, $$R_D = \Delta v/I_D = -1/(\beta_D \cdot V_{TD})$$

Where $\beta_D$ is a coefficient

Accordingly, in order to read the data at a high speed, the value of $|V_{TD}|$ must be set at a large value, and on the other hand, in order to enable to write data at a low level of Vdd, the value of $|V_{TD}|$ must be set at a small value. Namely, it is very difficult to set the value of $|V_{TD}|$.

SUMMARY OF THE INVENTION

Accordingly, it is an object of the present invention to provide an EPROM which has overcome the above mentioned defect of the conventional one.

Another object of the present invention is to provide an EPROM which does not require a depletion N-channel MOS-FET as the transfer gates in the row decoder and the column decoder.

Still another object of the present invention is to provide an EPROM which allows a low level of $|V_{TD}|$ but can write data at a high speed.

The above and other objects of the present invention are achieved in accordance with the present invention by a read only semiconductor memory comprising:

a memory cell array including a number of floating-gate type erasable programmable memory cells arranged in the form of a matrix having a plurality of rows and a plurality of columns;

a plurality of column lines each connected to the memory cells in a corresponding column of the matrix of the memory cell array;

a plurality of row lines each connected to the memory cells in a corresponding row of the matrix of the memory cell array;

a column decoder having an input for receiving an address signal and a plurality of outputs each outputted through a corresponding transfer gate;

a column selector having a plurality of column selection gates, each of which is on-off controlled by a corresponding one of the outputs of the column decoder through a corresponding one of the transfer gates of the column decoder;

a first pull-up circuit for applying a high voltage to the outputs of the column decoder;

a row decoder having an input for receiving an address signal and a plurality of outputs each outputted through a corresponding transfer gate to a corresponding one of the row lines;

a second pull-up circuit for applying a high voltage to the outputs of the row decoder;

a write circuit for applying, when data is written to a selected memory cell in the memory cell array, a high voltage to a column line connected to the selected memory cell;

a sense amplifier connected to the column lines for reading data from a selected memory cell in the memory cell array;

each of the transfer gates of the column decoder and the transfer gates of the row decoder being formed of a non-depletion field effect transistor; and a control circuit including a pump-up circuit for supplying a control signal to gates of all the non-depletion field effect transistors.

Here, the non-depletion field effect transistor can be exemplified by an enhancement type field effect transistor or a substrate $V_T$ type field effect transistor.

The above and other objects, features and advantages of the present invention will be apparent from the following description of preferred embodiments of the invention with reference to the accompanying drawings.

DESCRIPTION OF THE PREFERRED EMBODIMENTS

Figure 1:
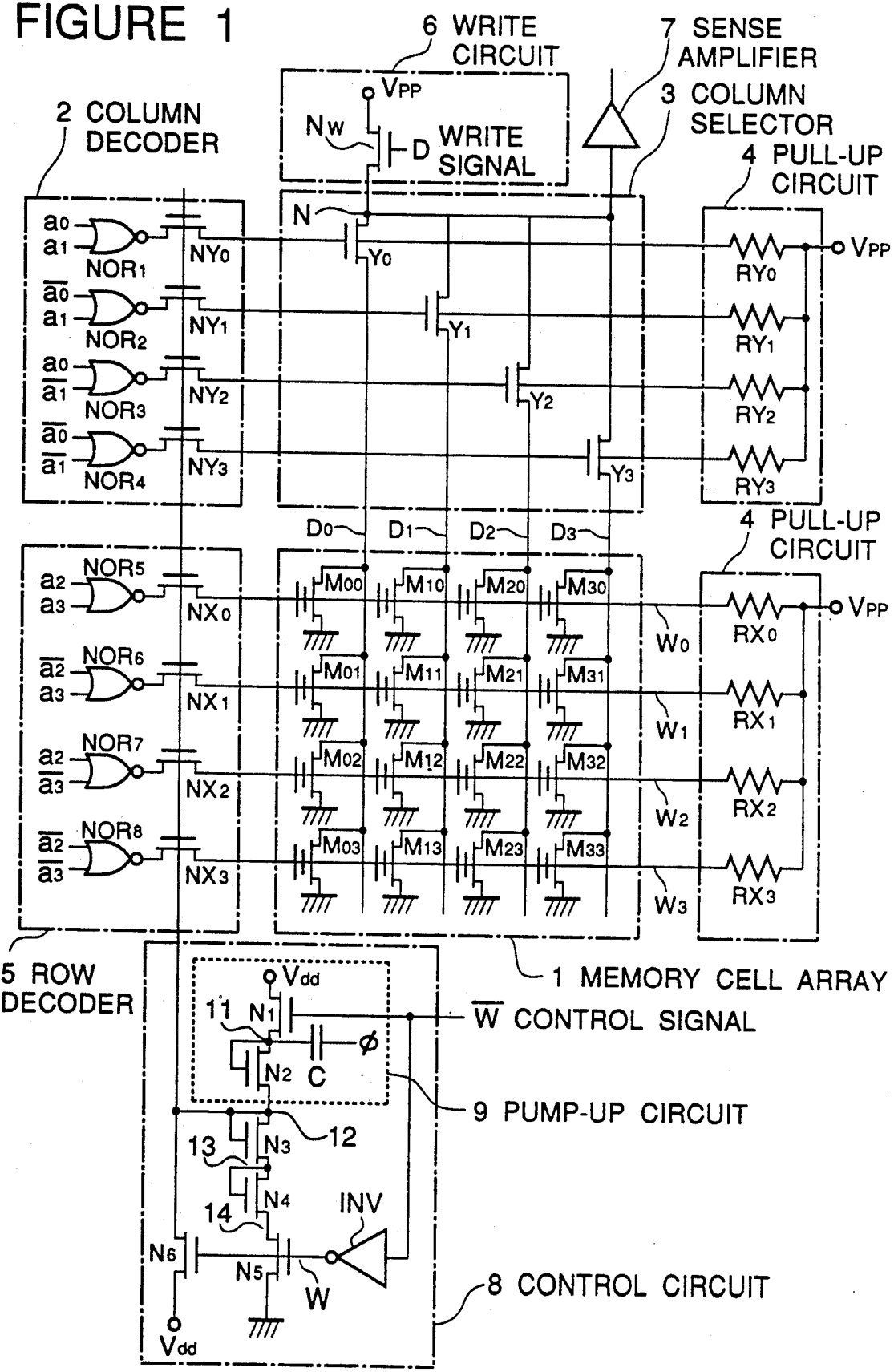
FIG. 1 is a circuit diagram of a first embodiment of the EPROM in accordance with the present invention.

Referring to FIG. 1, there is shown a block diagram of a first embodiment of the EPROM in accordance with the present invention.

The shown EPROM includes a memory cell array 1 composed of a number of erasable programmable memory cells $M_{00}$ to $M_{33}$ which are located in the form of a matrix having a plurality of rows and a plurality of columns. For example, each of the memory cells $M_{00}$ to $M_{33}$ is formed of a floating gate MOS-FET. A plurality of column lines $D_0$ to $D_3$ are provided in such a manner that each of the column lines $D_0$ to $D_3$ is connected in common to drains of the memory cells arranged in a corresponding column. A plurality of row lines $W_0$ to $W_3$ are provided in such a manner that each of the row lines $W_0$ to $W_3$ is connected in common to gates of the memory cells arranged in a corresponding row.

A column decoder 2 receiving address signals $a_0$ to $\overline{a_1}$, includes a array of four NOR gates $NOR_1$ to $NOR_4$ for decoding the address signals $a_0$ to $\overline{a_1}$. Outputs of the NOR gates $NOR_1$ to $NOR_4$ are respectively outputted through four transfer gates $NY_0$ to $NY_3$ formed of enhancement N-channel MOS-FETs.

Four outputs of the column decoder 2 are connected to a column selector 3, which includes four N-channel MOS-FETs $Y_0$ $Y_3$ having gates driven by a corresponding output of the column decoder 2. Each of the four N-channel MOS-FETs $Y_0$ to $Y_3$ is connected to a common read/write node N and a corresponding one of the column lines $D_0$ to $D_3$. In addition, in order to supply a high voltage to the four outputs of the column decoder 2, the four outputs of the column decoder 2 are pulled up through resistors $RY_0$ to $RY_3$ of a pull-up circuit 4 to a voltage Vpp.

A row decoder 5 receiving address signals $a_2$ to $\overline{a_3}$, includes a array of four NOR gates $NOR_5$ to $NOR_8$ for decoding the address signals $a_2$ to $\overline{a_3}$. Outputs of the NOR gates $NOR_5$ to $NOR_8$ are respectively outputted through four transfer gates $NX_0$ to $NX_3$ formed of enhancement N-channel MOS-FETs to the row lines $W_0$ to $W_3$, respectively. In addition, in order to supply a high voltage to the four outputs of the row decoder 5, the four outputs of the row decoder 5 are pulled up through resistors $RX_0$ to $RX_3$ of a pull-up circuit 4 to a voltage Vpp.

A write circuit 6 includes an N-channel MOS-FET Nw having a gate receiving a write signal D and connected at its one end to the voltage Vpp and at its other end to the common read/write node N connected to in common to all the column lines $D_0$ to $D_3$, so that when data is written, a high voltage is applied to a selected memory in the memory cell array 1. Furthermore, a sense amplifier 7 is connected to the common read/write node N for reading out data stored in the selected memory cell of the memory cell array 1.

In order to supply a control signal in common to the gates of the transfer gates $NY_0$ to $NY_3$ in the column decoder 2 and the gates of the transfer gates $NX_0$ to $NX_3$ in the row decoder 5, there is provided a control circuit 8 including a pump-up circuit 9 therein.

The pump-up circuit 9 of the control circuit 8 includes an N-channel MOS-FET $N_1$ having a drain connected to a voltage terminal Vdd, a source connected to a node 11 and a gate connected to receive a control signal $\overline{W}$, another N-channel MOS-FET $N_2$ having a drain and a gate connected to the node 11 and a source connected to a node 12, a capacitor C having one end connected to the node 11 and the other end connected to receive a clock $\phi$. In addition to the pump-up circuit 9 constructed as mentioned above, the control circuit 8 includes an N-channel MOS-FET $N_3$ having a drain and a gate connected to the node 12 and a source connected to a node 13, and another N-channel MOS-FET $N_4$ having a drain and a gate connected to the node 13 and a source connected to a node 14. The node 14 is connected to a drain of a still further N-channel MOS-FET $N_5$ having a source connected to the ground and a gate receiving an inverted control signal W supplied from an inverter INV having the gate connected to receive the control signal $\overline{W}$. The inverted control signal W is also supplied to a gate of a fourth N-channel MOS-FET $N_6$ having a drain connected to the power supply voltage Vdd and a source connected to the node 12.

Figure 2:
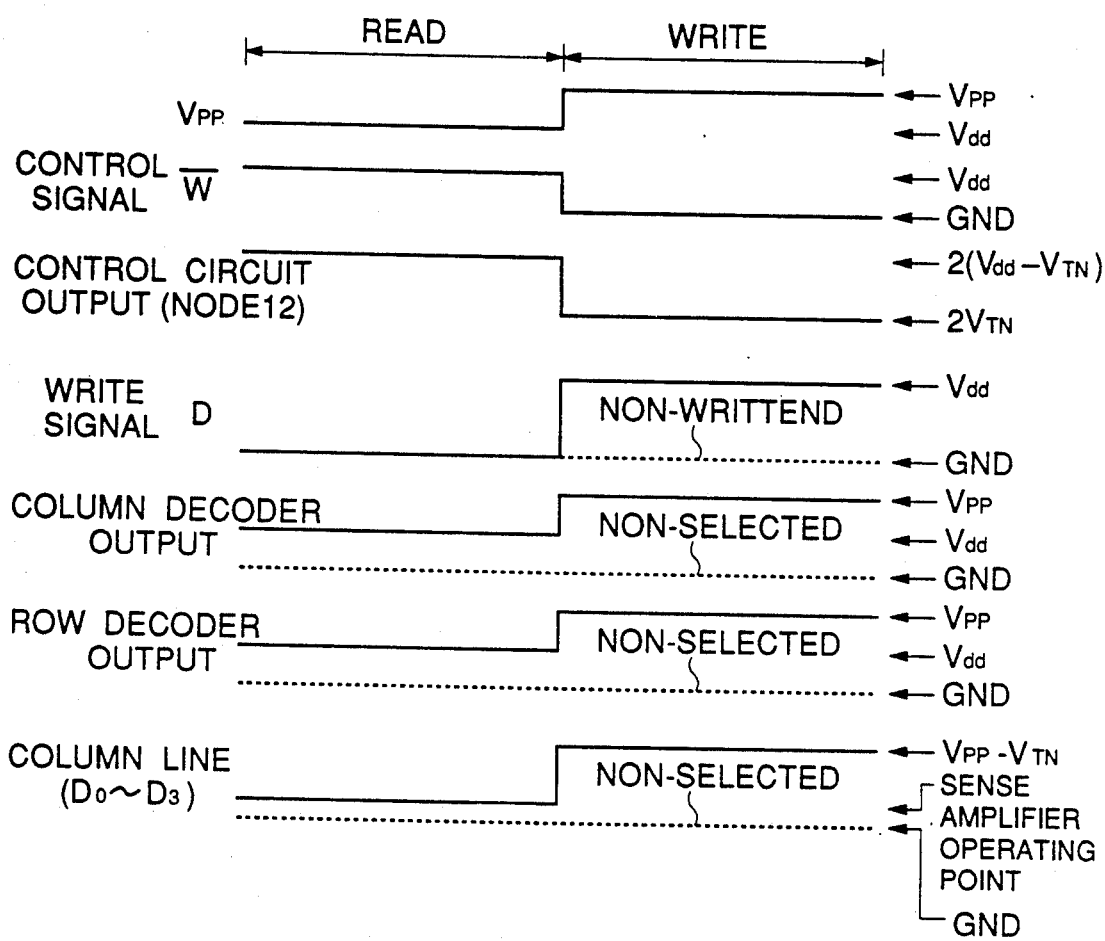
FIG. 2 is a timing chart illustrating the operation of the EPROM shown in FIG. 1.

Now, operation will be described with reference to FIG. 2.

In the case of reading one item of data stored in a selected memory cell, the voltage Vpp is brought to the power supply voltage Vdd, and the control signal $\overline{W}$ is brought to a high level (Vdd) and the write signal D is brought to a low level (GND). In addition, the clock $\phi$ is applied.

Under this condition, since the inverted control signal W of the control signal $\overline{W}$ is at a low level, the MOS-FETs $N_5$ and $N_6$ are turned off. Here, assuming that the N-channel MOS-FETs has a threshold of $V_{TN}$, the node 11 is charged up to a level of $(Vdd - V_{TN})$ through the MOS-FET $N_1$. If the clock $\phi$ changes between the ground level GND and the power supply voltage Vdd, a potential of the node 11 is raised to a level of $(2 Vdd - V_{TN})$ by action of the capacitor C. Thereafter, this voltage is outputted through the MOS-FET $N_2$ to the node 12, and hence to the gates of the transfer gates $NY_0$ to $NY_3$ in the column decoder 2 and the gates of the transfer gates $NX_0$ to $NX_3$ in the row decoder 5. Therefore, these transfer gates $NY_0$ to $NY_3$ and $NX_0$ to $NX_3$ are brought into a condition of allowing passage of a voltage not greater than $(2Vdd - 3V_{TN})$.

If the address signals of $a_0=0$, $a_1=0$, $a_2=0$ and $a_3=0$ are applied, the NOR gate $NOR_1$ is selected in the column decoder 2, so as to output a high level (Vdd), and the other NOR gates $NOR_2$ to $NOR_4$ output a low level (GND). As a result, the voltage of Vdd is applied to the gate of the N-channel MOS-FET $Y_0$ of the column selector 3, and the low level GND is applied to the gates of the N-channel MOS-FETs $Y_1$ to $Y_3$ of the column selector 3. Therefore, the column line $D_0$ and the input of the sense amplifier 7 are interconnected to the N-channel MOS-FET $Y_0$. Namely, the column line $D_0$ is selected.

On the other hand, the row decoder 5 operates similarly to the column decoder 2. The NOR gate $NOR_5$ is selected so as to output a high level (Vdd) so that the row line $W_0$ is brought to Vdd, and the other NOR gates $NOR_6$ to $NOR_8$ output a low level (GND) so that the other row lines $W_1$ to $W_3$ brought into the low level GND.

Here, the outputs of the column decoder 2 and the row decoder 5 are pulled to the voltage Vdd. Since the pull-up resistors $RY_0$ to $RY_3$ and $RX_0$ to $RX_3$ have a high resistance (for example, 1 M$\Omega$), the non-selected outputs of the column decoder 2 and the row decoder 5 are surely maintained at a low level.

Thus, the column line $D_0$ and the row line $W_0$ are selected, so that one item of data stored in the memory cell $M_{00}$ at the intersection of the selected column line $D_0$ and the selected row line $W_0$ is read out, and therefore outputted from the sense amplifier.

In the case of writing one item of data into a selected memory cell, the voltage Vpp is set to a high voltage level, for example 12.5 V, and the control signal $\overline{W}$ is set to the low level (GND). In this condition, the MOS-FET $N_1$ are turned off and the MOS-FETs $N_5$ and $N_6$ are turned on. Here, if the MOS-FET $N_6$ has a transconductance $g_m$ sufficiently smaller than that of the MOS-FETs $N_3$, $N_4$ and $N_5$, the node 12, namely, the output of the control circuit 8 outputs a voltage of 2 $V_{TN}$.

Figure 3:
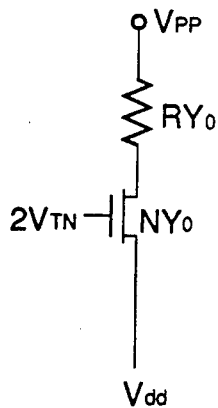
FIG. 3 is a circuit diagram illustrating a biased condition of the transfer gate.

At this time, if the address signals of $a_0=0$, $a_1=0$, $a_2=0$ and $a_3=0$ are applied similarly to the data reading case as mentioned above, the NOR gate $NOR_1$ of the column selector 2 outputs the high level of Vdd, the N-channel MOS-FET $NY_0$ of the transfer gate is put in a biased condition shown as shown in FIG. 3. Here, a condition for cutting off the N-channel MOS-FET $NY_0$ is Vdd > $V_{TN}$. Therefore, if Vdd=5 V and $V_{TN}=1$ V, the N-channel MOS-FET $NY_0$ is cut off, so that the drain of the N-channel MOS-FET $NY_0$, namely, the selected output of the column decoder is pulled up to the voltage Vpp by action of the resistor RY$_0$. Thus, the N-channel MOS-FET Y$_0$ of the column selector 3 is turned on, so that the column line D$_0$ is selected.

In the row decoder 5, the row lines W$_0$ is similarly selected so as to pulled up to the voltage Vpp, and the other row lines W$_1$ to W$_3$ are maintained at the low level. Here, if the write signal D is at the high level Vpp, "1" is written to the memory cell M$_{00}$, and if the write signal D is at the low level GND, "0" is written to the memory cell M$_{00}$.

Incidentally, by irradiating ultraviolet rays to the written memory cells, it is possible to erase the written memory cells.

Thus, it is possible to read data from an arbitrary memory cell and to write data to an arbitrary memory cell.

Figure 4:
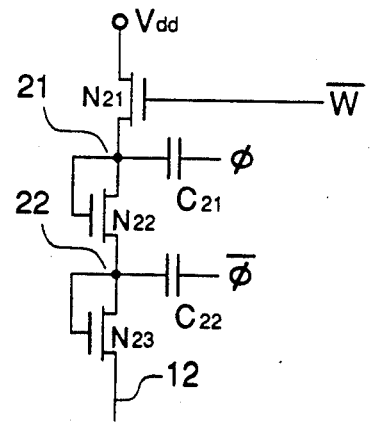
FIG. 4 is a circuit diagram of another example of the pump-up circuit which can be incorporated in the EPROM shown in FIG. 1.
Figure 5:
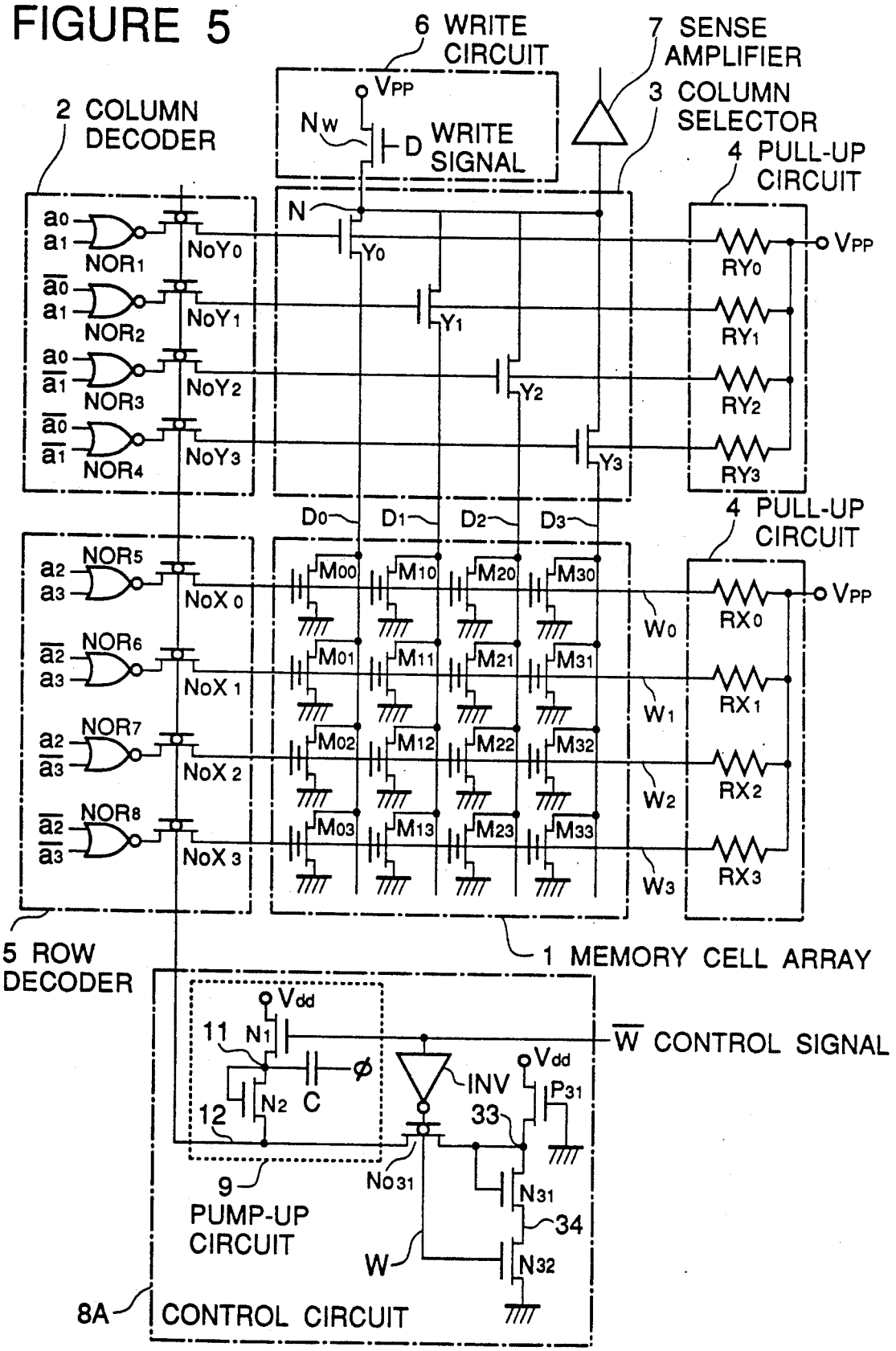
FIG. 5 is a circuit diagram of a second embodiment of the EPROM in accordance with the present invention.

Referring to FIG. 4, there is shown a second embodiment of the EPROM in accordance with the present invention. In FIG. 5, elements similar to those shown in FIG. 1 are given the same Reference Numerals, and explanation thereof will be omitted.

The transfer gates of the column decoder 2 and the row decoder 5 are formed of a substrate V$_T$ N-channel MOS-FETs N$_o$Y$_0$ to N$_o$Y$_3$ and N$_o$X$_0$ to N$_o$X$_3$, which have a threshold V$_{TNQ}$ in proximity of 0 V, since an ion implantation for controlling the threshold had not been executed. In order to supply a control signal in common to gates of all the substrate V$_T$ N-channel MOS-FETs N$_o$Y$_0$ to N$_o$Y$_3$ and N$_o$X$_0$ to N$_o$X$_3$, there is provided a control circuit 8A, which includes the pump-up circuit 9, similarly to the first embodiment.

The control circuit 8A includes a substrate V$_T$ N-channel MOS-FETs N$_{o31}$ having a drain connected to the node 12, a source connected to a node 33, and a gate connected to receive the inverted control signal W supplied from the inverter INV having the gate connected to receive the control signal $\overline{W}$, and a P-channel MOS-FET P$_{31}$ having a drain connected to the node 33, a source connected to voltage supply terminal Vdd and a gate connected to the ground GND. The control circuit 8A also includes an N-channel MOS-FET N$_{31}$ having a drain and a gate connected to the node 33 and a source connected to a node 34, and another N-channel MOS-FET N$_{32}$ having a drain connected to the node 34, a source connected to the ground GND and a gate connected to receive the inverted control signal W supplied from an inverter INV.

Now, operation will be described. In the case of reading one item of data stored in a selected memory cell, similarly to the first embodiment, the voltage Vpp is brought to the power supply voltage Vdd, and the control signal $\overline{W}$ is brought to a high level (Vdd) and the write signal D is brought to a low level (GND). In addition, the clock $\phi$ is applied.

Under this condition, the pomp-up circuit 9 outputs a voltage of 2(Vdd−V$_{TN}$) to the node 12, namely to the gates of all the substrate V$_T$ N-channel MOS-FETs N$_o$Y$_0$ to N$_o$Y$_3$ and N$_o$X$_0$ to N$_o$X$_3$ of the column decoder 2 and the row decoder 5. In addition, at this time, since the P-channel MOS-FET P$_{31}$ is turned on, and the N-channel MOS-FET N$_{32}$ is off, the node 33 is brought to a potential equal to the voltage Vdd. Since the gate of the substrate V$_T$ N-channel MOS-FETs N$_{o31}$ is at a low level (GND), the substrate V$_T$ N-channel MOS-FETs N$_{o31}$ is cut off. Under this condition, all the substrate V$_T$ N-channel MOS-FETs N$_o$Y$_0$ to N$_o$Y$_3$ and N$_o$X$_0$ to N$_o$X$_3$ are brought into a condition of allowing passage of a voltage not greater than (2 Vdd−2 V$_{TN}$−V$_{TNQ}$).

In this second condition, since V$_{TNQ}$≈0 V, it is advantageous in that the transfer gate can allow passage of a voltage which is higher than the first embodiment by (V$_{TN}$−V$_{TNQ}$), for example 1 V in the case of V$_{TN}$=1 V.

In the case of writing one item of data into a selected memory cell, the voltage Vpp is set to a high voltage level, for example 12.5 V, and the control signal $\overline{W}$ is set to the low level (GND). In this condition, the MOS-FET N$_1$ are turned off and the MOS-FETs N$_{o31}$ and N$_{32}$ are turned on. Here, if the MOS-FET P$_{31}$ has a transconductance g$_m$ sufficiently smaller than that of the MOS-FET N$_{31}$, the node 12, namely, the output of the control circuit 8A outputs a voltage of V$_{TN}$. Therefore, a condition for cutting off the N-channel MOS-FET NY$_0$ becomes Vdd>(V$_{TN}$−V$_{TNQ}$). Here, since since V$_{TNQ}$≈0 V, the condition of cutting off the transfer gate becomes Vdd>V$_{TN}$. This is the same as that of the first embodiment.

In the first embodiment, in order to ensure that the control circuit 8 stably outputs the voltage of 2 V$_{TN}$, it is required that the MOS-FETs N$_6$, N$_3$, N$_4$ and N$_5$ are on, and the voltage supply voltage Vdd must fulfil a condition of Vdd≧3 V$_{TN}$. On the other hand, in the second embodiment, in order to ensure that the control circuit 8A stably outputs the voltage of V$_{TN}$, it is sufficient if the MOS-FETs P$_{31}$, N$_{31}$ and N$_{32}$ are on, and the voltage supply voltage Vdd must fulfil a condition of Vdd≧|V$_{TP}$| (where V$_{TP}$ is a threshold of the P-channel MOS-FET), and Vdd≧V$_{TN}$. Therefore, the second embodiment can stably operate with a voltage supply voltage lower than that required in the first embodiment.

The pump-up circuit 9 included in the control circuits 8 and 11 outputs the voltage of 2(Vdd−V$_{TN}$) during the reading period. Instead of this pump-up circuit 9, a pump-up circuit shown in FIG. 4 can be used.

The pump-up circuit shown in FIG. 4 includes a first pump-up stage including an N-channel MOS-FET N$_{21}$ having a drain connected to the voltage terminal Vdd, a source connected to a node 21 and a gate connected to receive a control signal $\overline{W}$, another N-channel MOS-FET N$_{22}$ having a drain and a gate connected to the node 21 and a source connected to a node 22, and a capacitor C$_{21}$ having one end connected to the node 21 and the other end connected to receive a clock $\phi$. The pump-up circuit also includes a second pump-up stage including a third N-channel MOS-FET N$_{23}$ having a drain and a gate connected to the node 22 and a source connected to the node 22 which is an output of the pump-up circuit, and a capacitor C$_{22}$ having one end connected to the node 22 and the other end connected to receive an inverted signal $\overline{\phi}$ of a clock $\phi$. With this arrangement, it is possible to supply a voltage of 3(Vdd−V$_{TN}$).

In this connection, if "n" pump-up stages are incorporated in the pump-up circuit, it is possible to (n+1)(Vdd−V$_{TN}$), so that it is possible to arbitrarily set a voltage of the control signal for the data reading.

Figure 6:
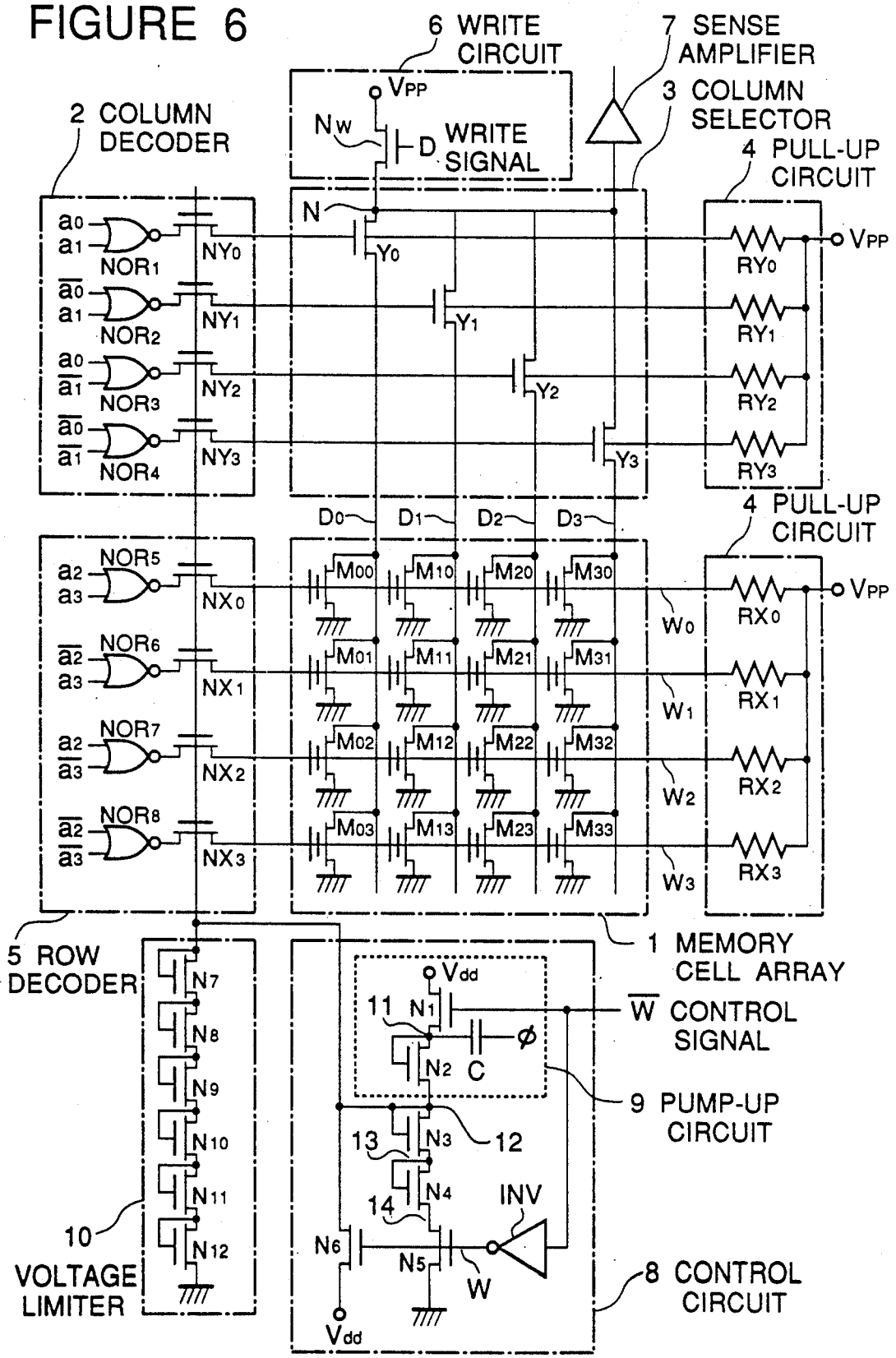
FIG. 6 is a circuit diagram of a third embodiment of the EPROM in accordance with the present invention.

Referring to FIG. 6, there is shown a circuit diagram of a third embodiment of the EPROM in accordance with the present invention. In FIG. 6, elements similar to those shown in FIG. 1 are given the same Reference Numerals, and explanation thereof will be omitted.

The third embodiment is different from the first embodiment only in that the third embodiment includes a voltage limiter circuit 10 connected to the output of the control circuit 8. The voltage limiter circuit 10 is composed of a series-connected N-channel MOS-FETs $N_7$ to $N_{12}$ having a drain and a gate directly connected to each other.

In this third embodiment, assuming that the voltage limiter circuit 10 operates to limit a voltage to a predetermined voltage $V_L$, the output voltage of the control circuit 8, namely the gate voltage applied to the gates of the transfer gates $NY_0$ to $NY_3$ of the column decoder 2 and the gates of the transfer gates $NX_0$ to $NX_3$ of the column decoder 5 in the data reading period is limited by the voltage $V_L$. Therefore, the output of the column decoder 2 and the output of the row decoder 5 is limited to Vdd at maximum in the case of $Vdd \leq (V_L - V_{TN})$ and to $(V_L - V_{TN})$ at maximum in the case of $Vdd > (V_L - V_{TN})$ If the voltage limiter circuit 10 is not provided, if Vdd is larger than $V_{TM}$ of the written memory cell, the memory cell which should be off is erroneously turned on so that an erroneous data is read out. However, if the voltage limiter circuit 10 is provided so as to ensure a relation of $\{(V_L - V_{TN}) > V_{TM}$ of the written memory cell$\}$, even if Vdd is high, the erroneous data will never be read out.

In the third embodiment, since the pull-up circuit for pulling up the output of the row decoder 6 to the voltage Vpp is composed of the resistors $RX_0$ to $RX_3$, the selected output of the row decoder 6 is pulled to the voltage Vpp. Therefore, the voltage Vpp is set to fulfil the relation of $Vpp \leq (V_L - V_{TN})$ during the reading period. Alternatively, each of the resistors $RX_0$ to $RX_3$ is replaced by a switching element, so that the pull-up circuit is constituted of the switching elements.

The above mentioned embodiments are applied to EPROMs which can be erased by ultraviolet ray irradiation and can be electrically written, namely, UV-PROMs. However, it would be apparent that the present invention can be EPROMs which can electrically erased and electrically written, namely, EEPROM.

As seen from the above, since the transfer gates of the column decoder and the row decoder are designed to receive at their gate a control signal supplied from a control circuit having a pump-up circuit, it is no longer necessary to constitute the transfer gates by a depletion N-channel MOS-FET, and therefore, the manufacturing process of the EPROM can be shortened.

In addition, the condition for cutting off the transfer gates of the column decoder and the row decoders during the write period so as to ensure a writable condition is $Vdd > V_{TN}$. On the other hand, assuming that a drain voltage, a gate voltage and a source voltage of the transfer gate are Vdd, $(Vdd - V_{TN})$ and $(Vdd - \Delta v)$, respectively, the ON resistance $R_N$ of the transfer gate required to be as small as possible during the reading period in order to read data at a high speed is as follows:

$$I_N = \beta_N \{(Vdd - 3V_{TN} + \Delta v) \cdot \Delta v - (\tfrac{1}{2})\Delta v^2\}$$
$$\approx \beta_N \cdot (Vdd - 3V_{TN}) \cdot \Delta v$$

Therefore, $$R_N = \Delta v / I_N = 1/\{\beta_N \cdot (Vdd - 3V_{TN})\}$$

The ON resistance $R'_N$ of the transfer gate when the gate voltage is $(n+1)(Vdd - V_{TN})$ is shown as follows:

$$R'_N = 1/\{\beta_N \cdot [n \cdot Vdd - (n+2)V_{TN}]\}$$

Accordingly, it is possible to freely set the ON resistance of the transfer gates during the reading period by selecting the construction of the pump-up circuit. Therefore, it becomes possible to write data at a low level of Vdd and to read data at a high speed.

Here, a writable level of Vdd and the ON resistance of the transfer gates will be examined in the EPROMs of the prior art and the present inventions under the condition of $Vdd = 5$ V, $V_{TD} = -2$ V and $V_{TN} = 1$ V:

|  | Writable Level of Vdd | ON resistance of Transfer Gates |
|---|---|---|
| Conventional EPROM | Vdd > 2 V | $R_D = 1/(2 \cdot \beta_D)$ |
| EPROM of Invention | Vdd > 1 V | $R_N = 1/(2 \cdot \beta_N)$ |
| EPROM of Invention (case of n = 2) | Vdd > 1 V | $R'_N = 1/(6 \cdot \beta_N)$ |

As seen from the above, the EPROM of the present invention can lower the writable level of Vdd. In addition, by increasing the number of the pump-up stages in the pump-up circuit, for example, n=2, the ON resistance of the transfer gate can be reduced to one third, assuming $\beta_D = \beta_N$. Furthermore, the reading operation can simultaneously be speeded up. If the voltage limited is added to the output of the control circuit including the pump-up circuit, even if Vdd is high, it is possible to prevent the erroneous data reading.

The invention has thus been shown and described with reference to the specific embodiments. However, it should be noted that the present invention is in no way limited to the details of the illustrated structures but changes and modifications may be made within the scope of the appended claims.

I claim:

1. A read only semiconductor memory comprising:
    a memory cell array including a number of floating-gate type erasable programmable memory cells arranged in the form of a matrix having a plurality of rows and a plurality of columns;
    a plurality of column lines each connected to the memory cells in a corresponding column of the matrix of the memory cell array;
    a plurality of row lines each connected to the memory cells in a corresponding row of the matrix of the memory cell array;
    a column decoder having an input for receiving an address signal and a plurality of outputs each outputted through a transfer gate;
    a column selector having a plurality of column selection gates, each of which is on-off controlled by a corresponding one of the outputs of the column decoder through a corresponding one of the transfer gates of the column decoder;
    a first pull-up circuit for applying a high voltage to the outputs of the column decoder;
    a row decoder having an input for receiving an address signal and a plurality of outputs each outputted through a transfer gate to a corresponding one of the row lines;
    a second pull-up circuit for applying a high voltage to the outputs of the row decoder;
    a write circuit for applying, when data is written to a selected memory cell in the memory cell array, a high voltage to a column line connected to the selected memory cell;

a sense amplifier connected to the column lines for reading data from a selected memory cell in the memory cell array;

each of the transfer gates of the column decoder and the transfer gates of the row decoder being formed of a non-depletion field effect transistor; and a control circuit including a pump-up circuit and receiving a control signal for supplying a gate voltage signal to gates of all the non-depletion field effect transistors.

2. A read only semiconductor memory claimed in claim 1 wherein a voltage limiter is connected to the output of the control circuit.

3. A read only semiconductor memory claimed in claim 1 wherein each of the non-depletion field effect transistors is of an enhancement type.

4. A read only semiconductor memory claimed in claim 3 wherein the pump-up circuit has an output connected to a first node, and the control circuit includes:

a first MOS-FET of a first conduction type having a drain and a gate connected to the first node and a source connected to a second node;

a second MOS-FET of the first conduction type having a drain and a gate connected to the second node and a source connected to a third node;

a third MOS-FET of the first conduction type having a drain connected to the third node, a source connected to a first voltage terminal, and a gate connected to receive an inverted signal of the control signal; and a fourth MOS-FET of the first conduction type having a drain connected to a second voltage terminal, a source connected to the first node, and a gate connected to receive the inverted signal of the control signal node.

5. A read only semiconductor memory claimed in claim 4 wherein a voltage limiter is connected to the output of the control circuit.

6. A read only semiconductor memory claimed in claim 1 wherein each of the non-depletion field effect transistors is of a substrate-$V_T$ type.

7. A read only semiconductor memory claimed in claim 6 wherein the pump-up circuit has an output connected to a first node, and the control circuit includes:

a first MOS-FET of a first conduction type and the substrate-$V_T$ type having a drain connected to the first node, a source connected to a second node and a gate connected to receive an inverted signal of the control signal;

a second MOS-FET of a second conduction type opposite to the first conduction type, having a drain connected to the second node, a source connected to a first voltage terminal, and a gate connected to a second voltage terminal;

a third MOS-FET of the first conduction type having a drain and a gate connected to the second node, a source connected to a third node; and a fourth MOS-FET of the first conduction type having a drain connected to the third node, a source connected to the second voltage terminal, and a gate connected to receive the inverted signal of the control signal.

8. A read only semiconductor memory claimed in claim 7 wherein a voltage limiter is connected to the output of the control circuit.

* * * * *